United States Patent
Henderson et al.

(10) Patent No.: US 6,817,821 B2
(45) Date of Patent: Nov. 16, 2004

(54) WAFER HANDLING FOR A REFLOW TOOL

(76) Inventors: Robert D. Henderson, 3445 E. Wildwood Dr., Phoenix, AZ (US) 85048; Xan D. Henderson, 1708 N. Nevada Way, Mesa, AZ (US) 85203

( * ) Notice: Subject to any disclaimer, the term of this patent is extended or adjusted under 35 U.S.C. 154(b) by 21 days.

(21) Appl. No.: 10/277,048

(22) Filed: Oct. 21, 2002

(65) Prior Publication Data

US 2004/0076495 A1 Apr. 22, 2004

(51) Int. Cl.$^7$ .............................................. B65G 25/00
(52) U.S. Cl. .................. 414/159; 414/211; 414/331.17; 414/938
(58) Field of Search ................................ 414/152, 159, 414/210, 211, 331.14, 331.17, 938

(56) References Cited

U.S. PATENT DOCUMENTS

| | | | | |
|---|---|---|---|---|
| 3,659,831 A | * | 5/1972 | Reber et al. ................. 266/132 |
| 4,338,056 A | * | 7/1982 | Abrahamson et al. ....... 414/152 |
| 4,367,915 A | * | 1/1983 | Georges ..................... 359/385 |
| 4,923,054 A | * | 5/1990 | Ohtani et al. ............... 187/267 |
| 5,337,880 A | * | 8/1994 | Claycomb et al. ........ 198/347.3 |
| 5,501,564 A | * | 3/1996 | Doche .................. 414/331.13 |
| 5,651,823 A | * | 7/1997 | Parodi et al. ................ 118/500 |
| 6,092,981 A | * | 7/2000 | Pfeiffer et al. .............. 414/810 |
| 6,375,062 B1 | | 4/2002 | Higdon et al. .............. 228/214 |
| 6,390,753 B1 | * | 5/2002 | De Ridder .................. 414/160 |
| 6,393,337 B1 | * | 5/2002 | Perlov et al. ............... 700/229 |
| 6,403,399 B1 | | 6/2002 | Pekin et al. ................. 438/118 |

* cited by examiner

Primary Examiner—Joe Dillon, Jr.

(57) ABSTRACT

The invention is an improved reflow tool for performing a reflow process on a wafer. An input robot may be used to transport wafers from an input carrier to an oven where a reflow process is performed. After processing the wafers in the oven, the wafers are transported to a storage carrier. In a preferred embodiment, the storage carrier includes a plurality of left and right slats that use chamfer tabs and centering tabs to precisely position the wafer as the wafer is loaded into the storage carrier. The storage carrier may be part of a buffer indexer that also includes an actuator for vertically positioning the storage carrier. An output robot may be used to sequentially remove the wafers from the storage carrier and to place the wafers in an output carrier. In another preferred embodiment, the power from a main power supply to the reflow tool is monitored and an uninterruptible power supply is used to power the oven and buffer indexer if power is lost. This allows the wafers in the oven to be safely moved to the storage carrier in the event of a loss of power from the main power supply.

13 Claims, 7 Drawing Sheets

WAFER HANDLING FOR A REFLOW TOOL

TECHNICAL FIELD

The present invention relates generally to a reflow tool used in a manufacture process for dies formed on a semiconductor wafer. The reflow tool performs a wafer bumping process (also known as solder bumping) to facilitate electrical connections between a die and a circuit board. Specifically, the handling of wafers within the reflow tool is improved to more precisely position wafers within a pass-through wafer carrier and to protect partially processed wafers in an oven in the event of a loss of power.

BACKGROUND OF THE INVENTION

Integrated circuits may be formed on one or more dies constructed from a semiconductor wafer. Dies are generally mounted on circuit boards that provide electrical pathways between the integrated circuits contained in the various dies. Traditionally, wires have been bonded to portions of the die to facilitate electrical connections between the die and the circuit board. The bonded wires allow the die to be easily connected to the circuit board through the use of a socket mounted on a circuit board or by soldering the bonded wires directly to electrical pathways on the circuit board. However the bonded wires, and possible addition of a socket, increase the size of the connection area of the die to the circuit board.

In order to reduce the size of the connection area between the die and the circuit board, the bonded wires may be replaced with solder bumps. The solder bumps typically line the edges of the dies and may be used to physically and electrically connect the dies to circuit boards. The solder bumps are created by placing a small amount of solder at the desired solder bump locations and performing a wafer bumping process on a wafer in a reflow tool. The wafer bumping process firmly adheres the solder to the die, thus creating solder bumps, and prepares the solder bumps for physical and electrical connection to a circuit board.

A solder bumping process typically involves sequentially removing wafers from an input carrier with a first robot and placing the wafers in an entrance to an oven. The oven may have a belt that the wafers are placed on that transports the wafers from the entrance to the exit of the oven. To improve the throughput of the reflow tool, a plurality of wafers may be on the belt at the same time. The temperature of the oven is sufficient to cause the solder to flow and form the desired solder bumps on the dies as each wafer moves from the entrance to the exit of the oven. As each wafer appears at the exit of the oven, the wafer is moved to a temporary storage area. A second robot may then be used to transport the wafer from the temporary storage area to an output carrier.

However, at least two problems may occur with the wafer handling of the above described conventional reflow tool. The first problem is that wafers are not consistently placed in the temporary storage area as they come off the belt. Small positional changes of a wafer in the temporary storage area may cause the second robot to position the wafer to far forward, or to far back, on the arm of the robot. If the wafer is too far back on the arm of the robot, the wafer may not be fully loaded into the output carrier causing the wafer to fall out of the output carrier and thereby possibly damaging the wafer. If the wafer is too far forward on the arm of the robot, the wafer may be rammed into the back of the output carrier as the robot attempts to load the wafer into the output carrier thereby also possibly damaging the wafer.

The second problem is that wafers in the oven will be damaged if electrical power is lost during the reflow process. Loss of electrical power will cause the belt to stop moving and the delicate integrated circuits on the wafers will be damaged by the extended cooking time in the oven. The wafers have gone through many manufacturing steps by the time they make it to the reflow process step and are thus very valuable.

What is needed is a reflow tool that precisely positions every wafer in the temporary storage area during the reflow process and that prevents wafers in the oven from being damaged in the event of loss of electrical power to the reflow tool.

SUMMARY OF THE INVENTION

The different embodiments of the invention may include one or more of the following objectives. One objective is to provide a storage carrier that consistently positions wafers in a desired location as the wafers exit an oven in a reflow tool. Another objective is to provide a reflow tool that does not damage wafers that happen to be in the reflow tool's oven in the event of a power loss from the main power supply.

The present invention provides a reflow tool for performing a reflow process on a semiconductor. The reflow tool includes an input wafer carrier for loading a new batch of wafers to be processed on the reflow tool. An input robot may be used to transport wafers from the input carrier to an entrance of an oven. The oven preferably has means for reaching a temperature sufficient to allow solder to flow and means for moving wafers through the oven, such as by a belt. A storage carrier may be positioned to receive wafers as the wafers exit from the oven. In a preferred embodiment, the storage carrier has mechanical means, such as chamfer tabs at the front face of the storage carrier to guide the wafer into the storage carrier and centering tabs towards the back face of the storage carrier to precisely align the wafer in the storage carrier. The storage carrier may be part of a buffer indexer that also includes an actuator for vertically positioning the storage carrier. An output robot may be used to sequentially remove the wafers from the storage carrier and place them in an output carrier.

In another embodiment of the invention, the electrical power from a main power supply is monitored during the reflow process. If power is lost, an uninterruptible power supply supplies power to the oven and buffer indexer to allow the oven and buffer indexer to move all the wafers in the oven to the storage carrier of the buffer indexer to prevent the wafers from being damaged by excessive exposure to the heat in the oven.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF EXEMPLARY EMBODIMENTS

An improved method and apparatus for handling wafers within a reflow tool will now be described. In the following description, numerous specific details are set forth illustrating Applicants' best mode for practicing the invention and enabling one of ordinary skill in the art to make and use the invention. It will be obvious, however, to one skilled in the art that the present invention may be practiced without these specific details. In other instances, well-known machines and process steps have not been described in particular detail in order to avoid unnecessarily obscuring the present invention.

Figure 1:
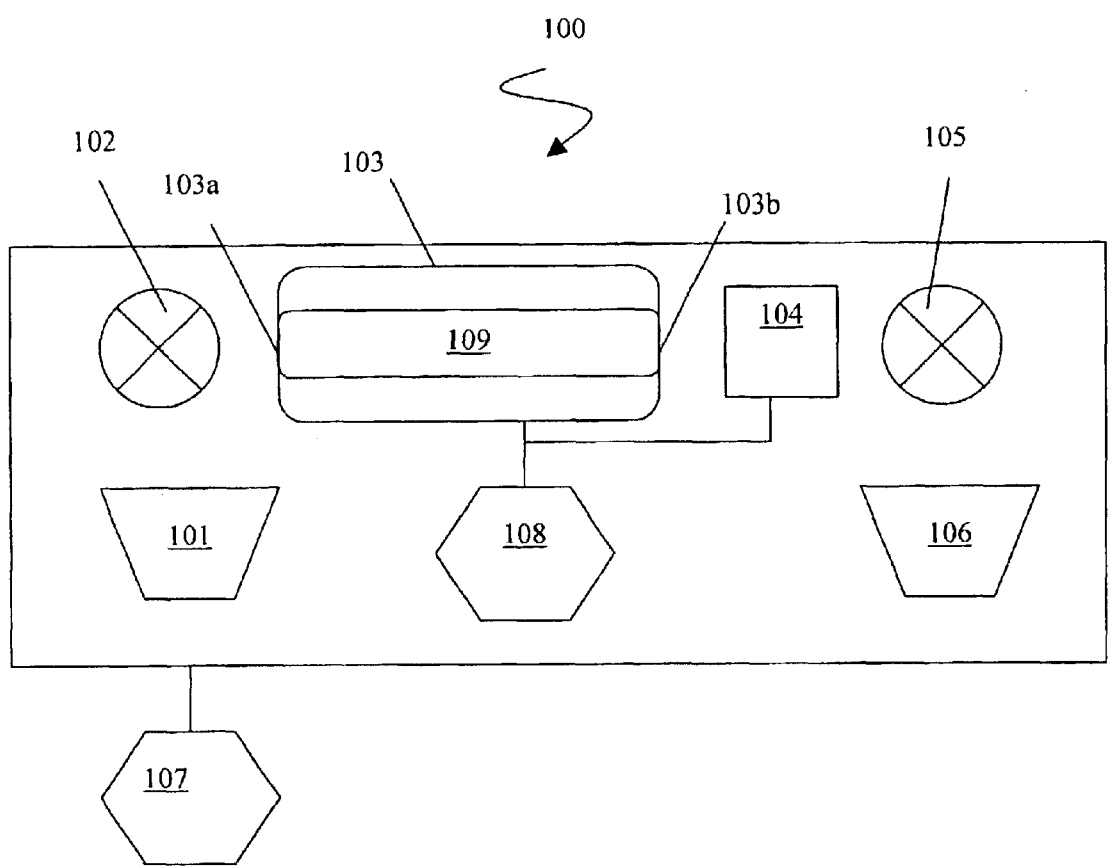
FIG. 1 is a plan view of an exemplary reflow tool.
Figure 5:
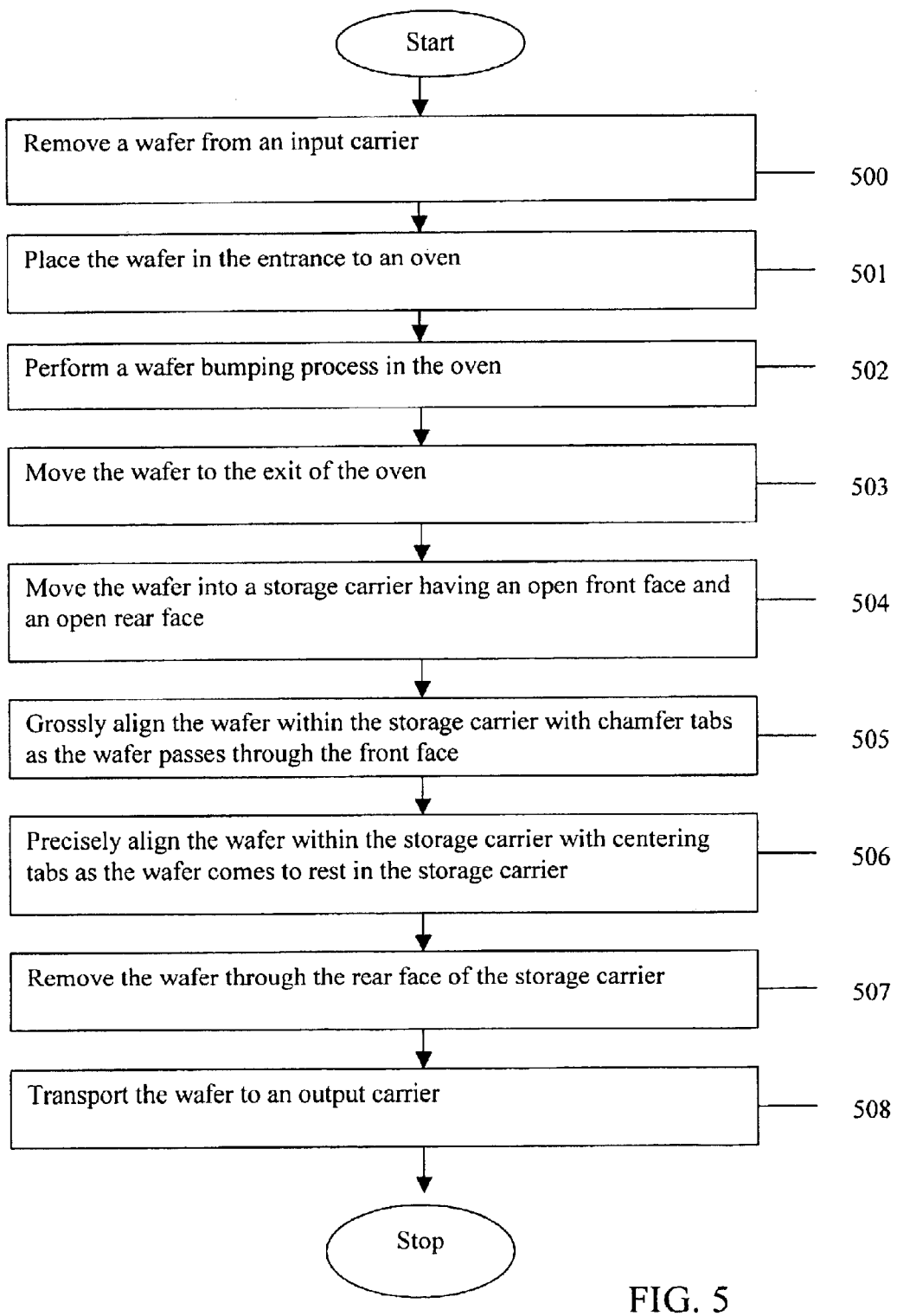
FIG. 5 is a flowchart illustrating an exemplary process according to an embodiment of the invention.

The present invention provides a reflow tool for performing a reflow process on semiconductor wafers. A plan view of a possible layout of a reflow tool 100 is illustrated in FIG. 1 and a flow chart of a possible process is illustrated in FIG. 5. An input carrier 101 may be used to load a plurality of wafers to be processed in the reflow tool 100. The input carrier 101 will typically hold about 25 wafers or less to allow for human handling, but may be given a larger carrying capacity to reduce the number of times an empty input carrier 101 needs to be replaced by a full input carrier 101. Further reflow tool 100 efficiencies may be achieved by allowing multiple input carriers to be mounted on the reflow tool 100 at the same time.

An input robot 102 may be used to sequentially remove the wafers from the input carrier 101. (Step 500) At this point, the incoming wafers may need to have a precisely controlled quantity of solder deposited on the bond pads of the die. This may be accomplished using the input robot 102 to transport the wafers to a processing station (not shown) that performs the necessary processes to deposit the solder, for example, an electrodeposition process and a printing process. The input robot 102 may then sequentially move the wafers to the entrance 103a of the oven 103. If the wafers in the input carrier already have the solder deposited on their bond pads, the input robot 102 may sequentially move the wafers from the input carrier 101 directly to the entrance 103a of the oven 103. (Step 501)

The oven 103 has a carefully controlled temperature, hot enough to allow the solder to flow and create the desired solder bumps, but not hot enough to damage the integrated circuits on the dies during the short length of time the wafer is in the oven 103. In a preferred embodiment, the oven 103 has a belt 109 that the wafers are placed upon that rotates at a controlled speed. The belt 109 may be used to move the wafers from the entrance 103a to the exit 103b of the oven 103 (Step 503) and the speed of the belt 109 may be used to control the length of time the wafers are in the oven 103. The wafer bumping process may be performed on the wafers as the wafers travel through the oven 103. (Step 502)

Figure 2:
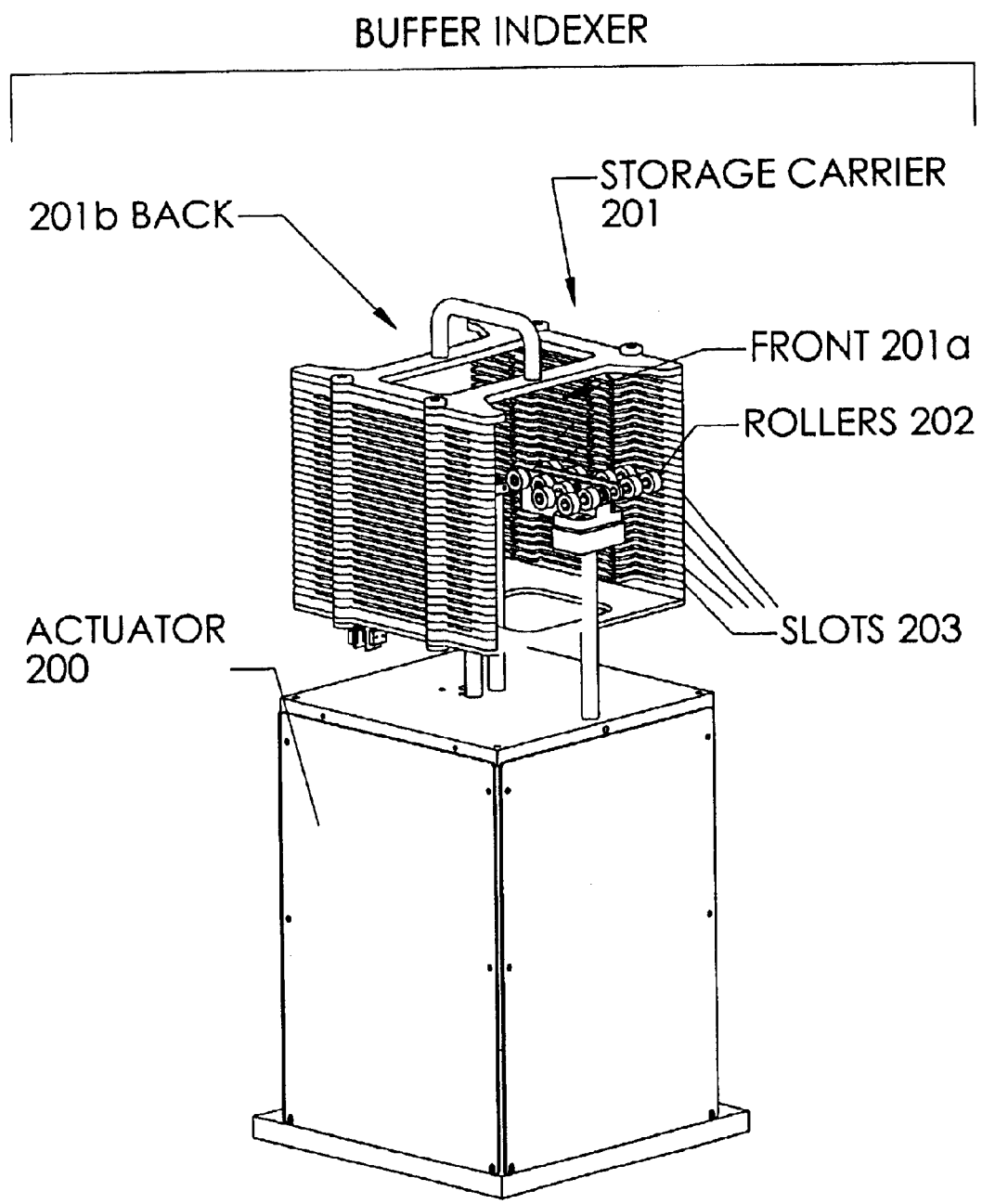
FIG. 2 is a perspective view of an exemplary buffer indexer.

As the wafers pass through the exit 103b of the oven 103, the wafers are moved into a buffer indexer 104. (Step 504) An exemplary buffer indexer 104 is illustrated in FIG. 2. The buffer indexer 104 may have an actuator 200 and a storage carrier 201. The actuator 200 is preferably an electrical motor that can precisely move the storage carrier 201 along a vertical axis. The storage carrier 201 may have a plurality of slots 203 where each slot is suited to hold one wafer. The buffer indexer 104 may also have motorized rollers 202 to assist in moving wafers from the exit 103b of the oven 103 to an open slot in the storage carrier 201. The buffer indexer 104 is thus able to safely receive a plurality of wafers as they leave the exit 103b of the oven 103. An output robot 105 may be used to sequentially remove wafers from the storage carrier 201 and place the wafers in an output carrier 106.

Figure 3:
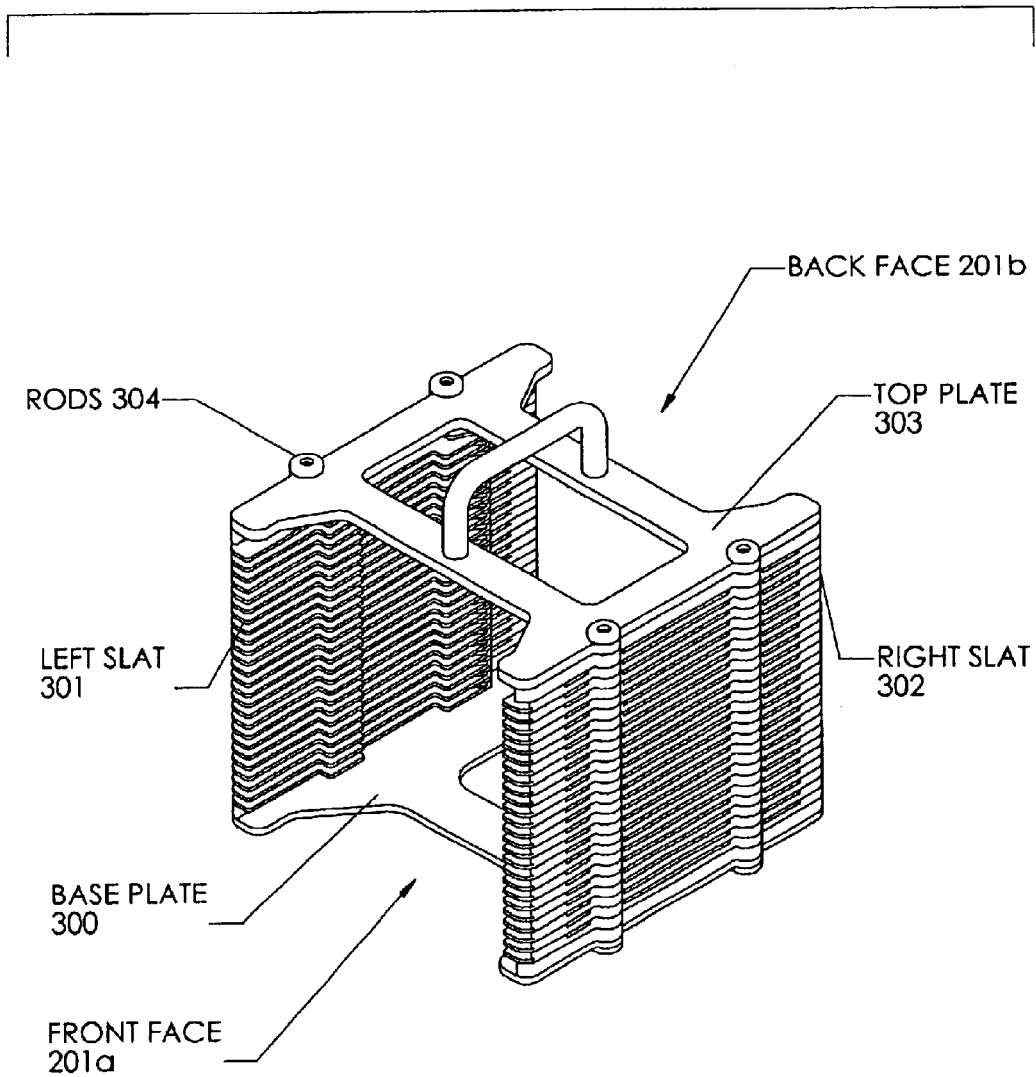
FIG. 3 is a perspective view of an exemplary storage carrier.

An exemplary storage carrier 201 is illustrated in FIG. 3. The storage carrier 201 is preferably of a pass-through type, where wafers may be moved into the storage carrier 201 through a front face 201a and removed from the storage carrier 201 through a back face 201b. The illustrated storage carrier 201 includes a base plate 300, a plurality of left slats 301 stacked on the left edge of the base plate 300, a corresponding plurality of right slats 302 stacked on the right edge of the base plate 300, and a top plate 303 mounted on top of the left 301 and right 302 slats. In a particularly preferred storage carrier 201, apertures are created in the left 301 and right 302 slats to allow a plurality of rods 304 to be passed through the apertures and fixed to the base plate 300 and top plate 303 to hold the storage carrier 201 together.

Figure 4:
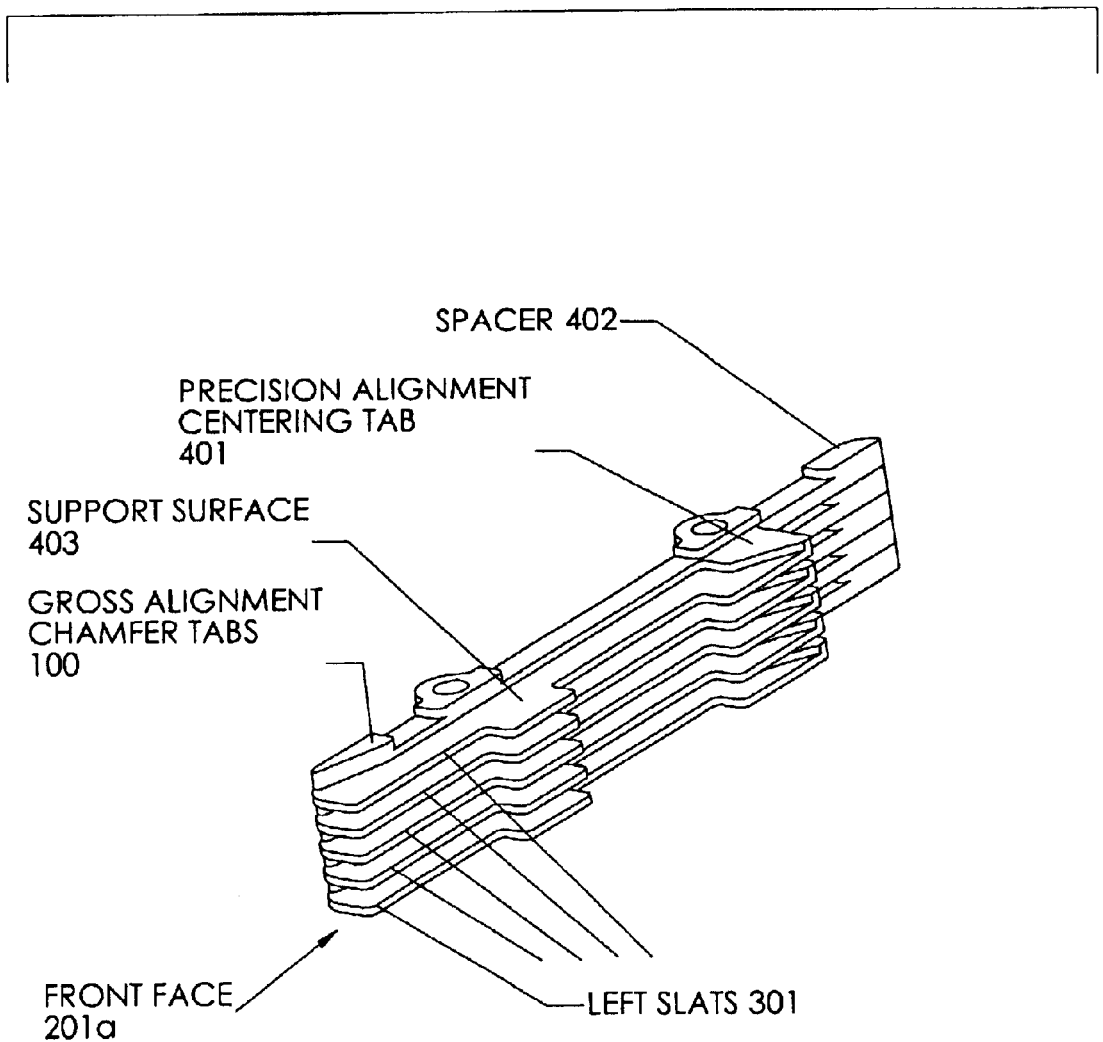
FIG. 4 is a perspective view of an exemplary mechanical alignment system that may be used in the storage carrier.

An exemplary design for the plurality of left slats 301, with an exemplary design of the right slats 302 simply being a mirror image of the design as shown, is illustrated in FIG. 4. Chamfer tabs 400 on the left 301 and right 302 slats may be used to grossly align a wafer as the wafer passes the front face 201a of the storage carrier 201. (Step 505) In a preferred embodiment, the chamfer tabs 400 are about 32 mm in length, and start with a thickness of about 3 mm and increase to a thickness of about 11 mm. Centering tabs 401 on the left 301 and right 302 slats are positioned near the back face 201b of the storage carrier 201 and may be used to precisely align a wafer within the storage carrier 201 as the wafer comes to rest in the storage carrier 201. (Step 506)

In a preferred embodiment, the left 301 and right 302 slats have features with at least 3 different vertical heights. Since each corresponding pair of stacked left 301 and right 302 slat is preferably going to house one wafer, the first, and largest, vertical height for the slats should be at least the thickness of one wafer plus the space required to insert and remove a wafer from the storage carrier 201. In the illustrated example, the chamfer tab 400 and rear spacer 402 are at the first vertical height to provide this space. This first vertical height may be about 10 mm. The centering tab 401 may be at a second vertical height. The centering tab 401 is preferably at a sufficient height to make contact with a wafer during insertion through the front face 201a, but low enough so the wafer can be lifted over the centering tab 401 and removed through the back face 201b of the storage carrier 201. This second vertical height may be about 6 mm. A support surface 403 may be at a third vertical height. The support surface 403 supports the edges of a wafer while the wafer is resting in the storage carrier 201. The third vertical height merely needs to be sufficient to provide the structural strength the support surface 403 needs to support a wafer and may be about 3 mm.

It should be noted that while a specific preferred storage carrier 201 has been described in some detail above, other conventional designs for storage carriers 201, for example those made from one sold piece, that are known in the industry may also be used without departing from the scope of the present invention.

Figure 6A:
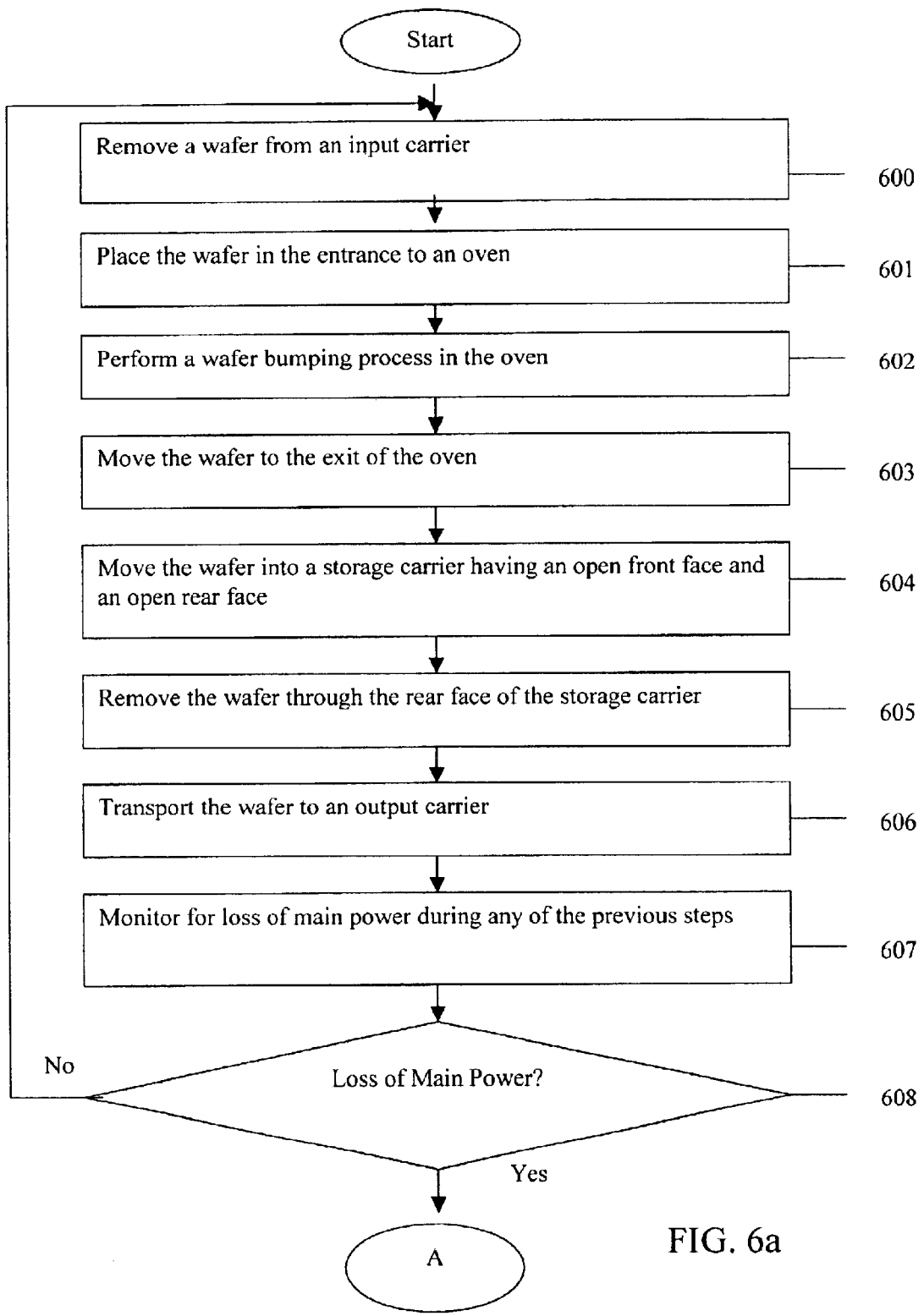
FIGS. 6a and 6b are flowcharts illustrating an exemplary process according to an embodiment of the invention.

Another embodiment of the invention will now be described with continuing reference to FIG. 6a. Electrical power is applied to the reflow tool 100 by main power supply 107. Wafers are sequentially removed from input carrier 101 by input robot 102 (Step 600) and placed in the entrance 103a of the oven 103 (Step 601). A wafer bumping process is performed on the wafers creating solder bumps on the dies of the wafers (Step 602) as the wafers traverse the oven 103 on a belt 109 (Step 603). The wafers are sequentially removed from the exit 103b of the oven 103 and stored in buffer indexer 104. (Step 604) The wafers are sequentially removed from the back face 201b of the storage carrier 201 by output robot 105 (Step 605) and placed in output carrier 106 (Step 606). Steps 600 to 606 should be repeated until all the wafers in the input carrier 101 have been processed and stored in output carrier 106.

Figure 6B:
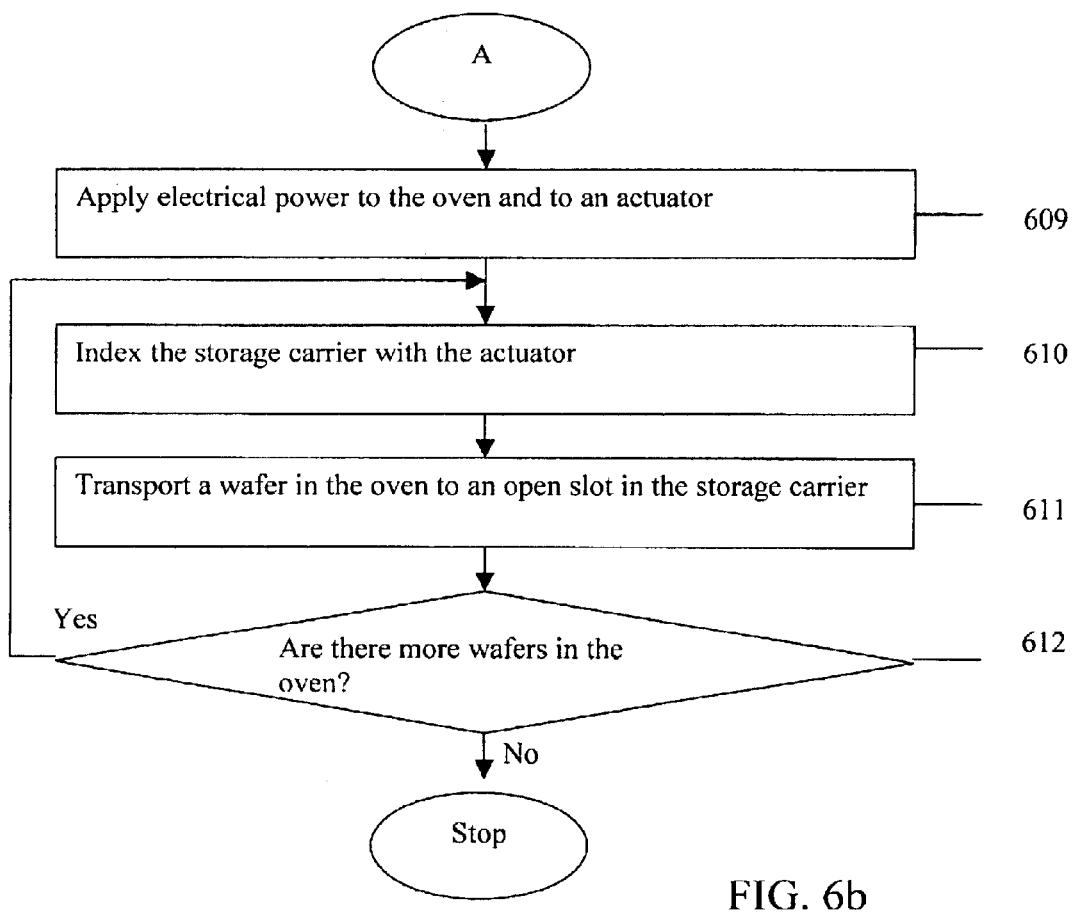

During any part, or preferably during all parts, of Steps 600 to 606, the electric power from the main power 107 may be monitored. (Step 608) If electrical power from the main power 107 where to be lost during Steps 600 to 606, the wafers in the oven 103 would almost certainly be damaged due to excessive cooking time in the oven 103. To prevent damage to wafers in the oven 103 during a power failure of the main power supply 107, the process disclosed in FIG. 6b may be performed. An uninterruptible power supply 108 supplies electrical power to at least a portion of the oven 103 and the buffer indexer 104. (Step 609) The actuator 200 adjusts the storage carrier's 201 vertical position so that an open slot is positioned to receive a wafer from the exit 103b of the oven 103. (Step 610) The oven 103 advances the next wafer to the exit 103b of the oven 103. (Step 611) Steps 610 and 611 are repeated until all wafers in the oven 103 have been safely stored in the storage carrier 201. (Step 612)

While the invention has been described with regard to specific embodiments, those skilled in the art will recognize that changes can be made in form and detail without departing from the spirit and scope of the invention. For example, a preferred storage carrier design was given in great detail, however, one skilled in the art will recognize that many variations may be made to this feature for different embodiments of this invention. The scope and breadth of the invention is defined in the claims.

We claim:

1. A reflow tool for performing a reflow process on a semiconductor wafer comprising:
    a) an input wafer carrier;
    b) an oven having an entrance and an exit;
    c) an input robot for transporting a wafer from the input wafer carrier to the entrance of the oven;
    d) a buffer indexer positioned to receive the wafer from the exit of the oven, wherein the buffer indexer comprises: a storage carrier having a plurality of slots, wherein at least one slot has a mechanical alignment system for consistently positioning a wafer within the slot; and an actuator for positioning the storage carrier;
    e) an output wafer carrier; and
    f) an output robot for transporting the wafer from the buffer indexer to the output wafer carrier.

2. The reflow tool of claim 1 wherein the storage carrier has an open front face allowing the insertion of a wafer into one of the slots and an open back face allowing the removal of a wafer from the one of the slots.

3. The reflow tool of claim 2 wherein the mechanical alignment system comprises a left chamfer tab and a right chamfer tab in each of the plurality of slots to provide gross alignment of a wafer as the wafer passes through the front face of the storage carrier.

4. The reflow tool of claim 2 wherein the mechanical alignment system comprises a left centering tab and a right centering tab in each of the plurality of slots to prove precision alignment of a wafer as the wafer is inserted into the slot.

5. The reflow tool of claim 2 wherein the mechanical alignment system comprises a left chamfer tab, a right chamber tab, a left centering tab, and a right centering tab.

6. The reflow tool of claim 2 further comprising a plurality of motorized rollers positioned between the exit of the oven and the storage carrier.

7. A reflow tool electrically connected to a main power supply for wafer bumping during a reflow process of a semiconductor wafer comprising:
    a) an input wafer carrier;
    b) an oven having an entrance and an exit;
    c) an input robot for transporting a wafer from the input wafer carrier to the entrance of the oven;
    d) a buffer indexer positioned to receive the wafer from the exit of the oven.
    e) an output wafer carrier;
    f) an output robot for transporting the wafer from the buffer indexer to the output wafer carrier; and
    g) an uninterruptible power supply electrically connected to the oven and the buffer indexer adapted to automatically turn on if power is lost from the main power supply.

8. The reflow tool of claim 7, wherein the buffer indexer comprises: a storage carrier having a plurality of slots, wherein at least one slot has a mechanical alignment system for consistently positioning a wafer within the slot; and an actuator for positioning the storage carrier.

9. The reflow tool of claim 8 wherein the storage carrier has an open front face allowing the insertion of a wafer into one of the slots and an open back face allowing the removal of a wafer from the one of the slots.

10. The reflow tool of claim 9 wherein the mechanical alignment system comprises a left chamfer tab and a right chamfer tab in each of the plurality of slots to provide gross alignment of a wafer as the wafer passes through the front face of the storage carrier.

11. The reflow tool of claim 9 wherein the mechanical alignment system comprises a left centering tab and a right centering tab in each of the plurality of slots to provide precision alignment of a wafer as the wafer is inserted into the slot.

12. The reflow tool of claim 9 wherein the mechanical alignment system comprises a left chamfer tab, a right chamber tab, a left centering tab, and a right centering tab.

13. The reflow tool of claim 9 further comprising a plurality of motorized rollers positioned between the exit of the oven and the storage carrier.

* * * * *